United States Patent [19]
Imahashi

[11] Patent Number: 5,586,047
[45] Date of Patent: Dec. 17, 1996

[54] SYSTEM FOR CREATING DATAPATH CIRCUIT LAYOUT

[75] Inventor: Masahiko Imahashi, Tokyo, Japan

[73] Assignee: NEC Corporation, Tokyo, Japan

[21] Appl. No.: 319,843

[22] Filed: Oct. 7, 1994

[30] Foreign Application Priority Data

Oct. 7, 1993 [JP] Japan .................................. 5-251262

[51] Int. Cl.⁶ .................................................. G06F 17/50
[52] U.S. Cl. ........................... 364/491; 364/489; 364/490
[58] Field of Search ..................................... 364/489, 490, 364/491, 488

[56] References Cited

U.S. PATENT DOCUMENTS

| | | | |
|---|---|---|---|
| 4,890,238 | 12/1989 | Klein et al. | 364/491 |
| 4,922,432 | 5/1990 | Kobayashi et al. | 364/489 |
| 5,038,294 | 8/1991 | Arakawa et al. | 364/491 |
| 5,119,313 | 6/1992 | Shaw et al. | 364/491 |
| 5,173,864 | 12/1992 | Watanabe et al. | 364/491 |
| 5,197,016 | 3/1993 | Sugimoto et al. | 364/490 |
| 5,231,589 | 7/1993 | Itoh et al. | 364/490 |
| 5,309,372 | 3/1994 | Marui et al. | 364/491 |
| 5,331,572 | 7/1994 | Takahashi | 364/491 |

Primary Examiner—Vincent N. Trans
Assistant Examiner—Thai Phan
Attorney, Agent, or Firm—Young & Thompson

[57] ABSTRACT

Input of only circuit configuration data of datapath section cells constructing datapath section leads to an automatic determination of configurations at cell level of peripheral circuit corresponding to the datapath section for subsequent determinations of the layout of datapath circuit layout from configuration data and netlists of the peripheral circuit, the datapath section cells and the standard cells. It is not necessary to prepare the peripheral circuit function descriptive library according to the configuration data of the datapath sections. This facilitates the creation of the layout of the datapath circuit and reduces the necessary time for creating the same because all the descriptive levels may be unified to the cell level.

4 Claims, 6 Drawing Sheets

SYSTEM FOR CREATING DATAPATH CIRCUIT LAYOUT

BACKGROUND OF THE INVENTION

The invention relates to a system for creating a datapath circuit layout, and more particularly to a system for creating layouts of datapath circuits for achieving a separation layout of a datapath section from a peripheral circuit.

Figure 1A:
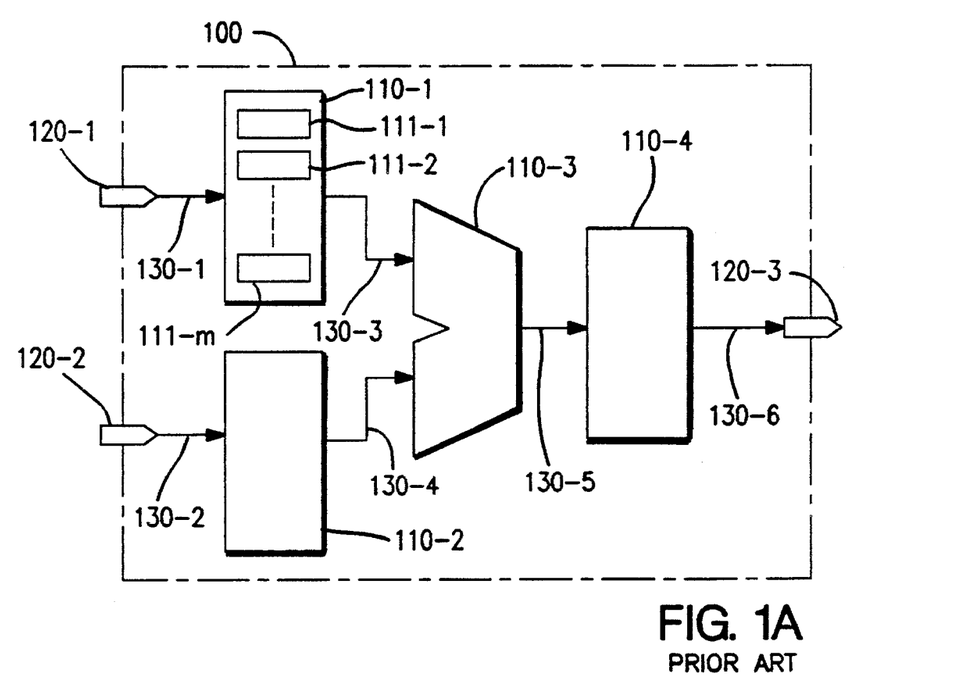
FIGS. 1A, 1B and 1C are block diagrams illustrative of the RT circuit configurations.
Figure 1B:
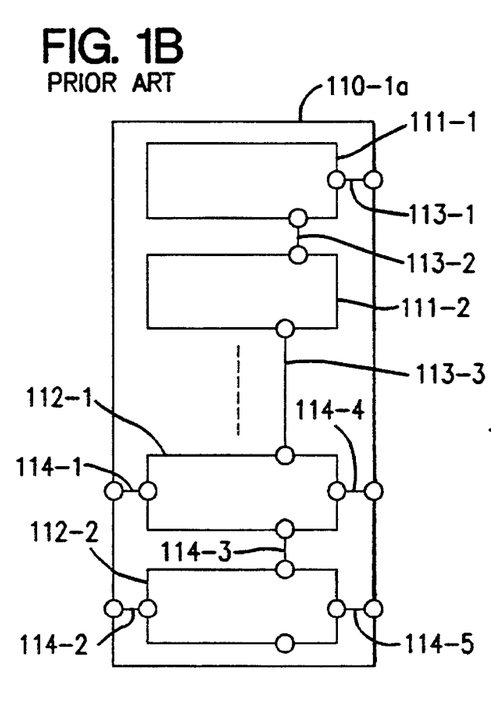
Figure 1C:
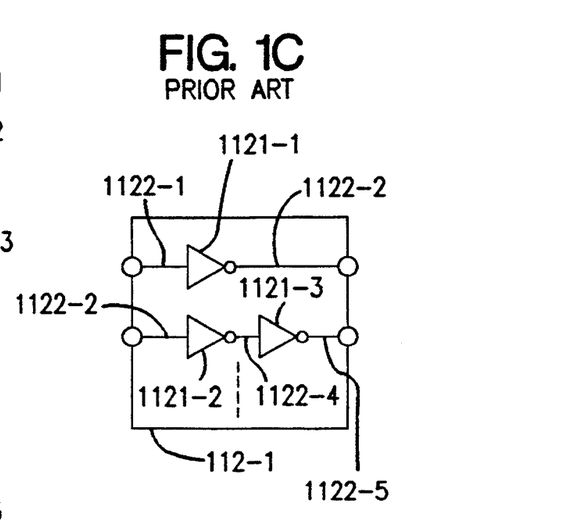

The datapath circuits for microprocessors will be described prior to descriptions of a conventional datapath circuit layout creation system. FIGS. 1A to 1C illustrate configurations of datapath circuits. The datapath circuits include a plurality of datapath sections 110-1, 110-2, 110-3 and 110-4 and terminals 120-1, 120-2 and 120-3 in which individual datapath sections are connected to each other through connection paths. Each of the datapath sections includes a plurality of cells or datapath section cells 111-1, 111-2 and a plurality of peripheral circuits 112-1 and 112-2 as illustrated in FIG. 1B. The datapath section cells are connected to each other through connection paths. The datapath section cell includes one of arithmetic units such as arithmetic logic unit (ALU), a resist, a multiplexer and a buffer, while the peripheral circuit is provided for input/output of signals into and from the datapath section cell. The peripheral circuit may comprise a plurality of standard cells such as inventor and logic gates. The datapath section cell corresponds to a resistor transfer (RT) level. The datapath circuit may be called as a resistor transfer circuit or (RT circuit).

Figure 2A:
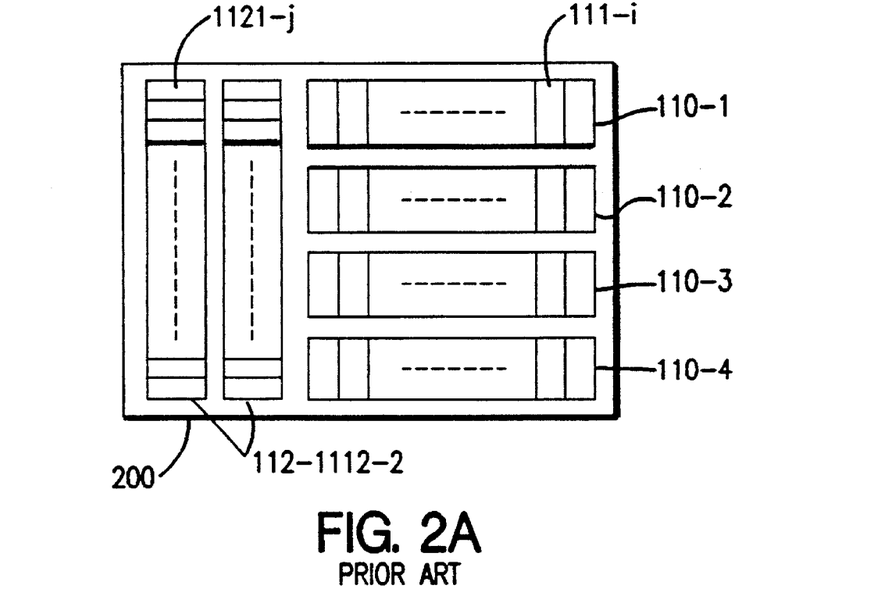
FIGS. 2A and 2B are block diagrams illustrative of the datapath circuit layouts.
Figure 2B:
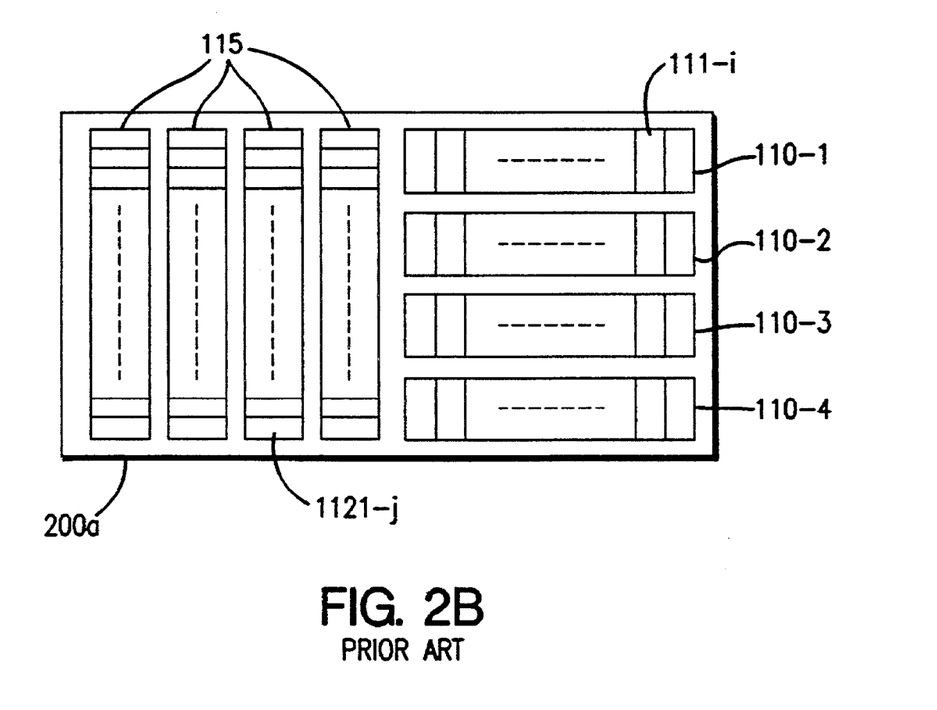

The description will be back to the datapath circuit layout creation system. FIG. 2A illustrates a layout 200 of the datapath circuit as a result of the automatic layout by the conventional datapath circuit layout creation system in which the datapath circuit does not include any control system for controlling operations of the datapath circuits. FIG. 2B illustrates a layout 200a of the datapath circuit as a result of the automatic layout by the conventional datapath circuit layout creation system in which the datapath circuit includes a control system 115 for controlling operations of the datapath circuits. From FIGS. 2A and 2B, the layout was made to separate the datapath sections 110 from the peripheral circuits 112 or from peripheral circuits/control systems 115.

Figure 3:
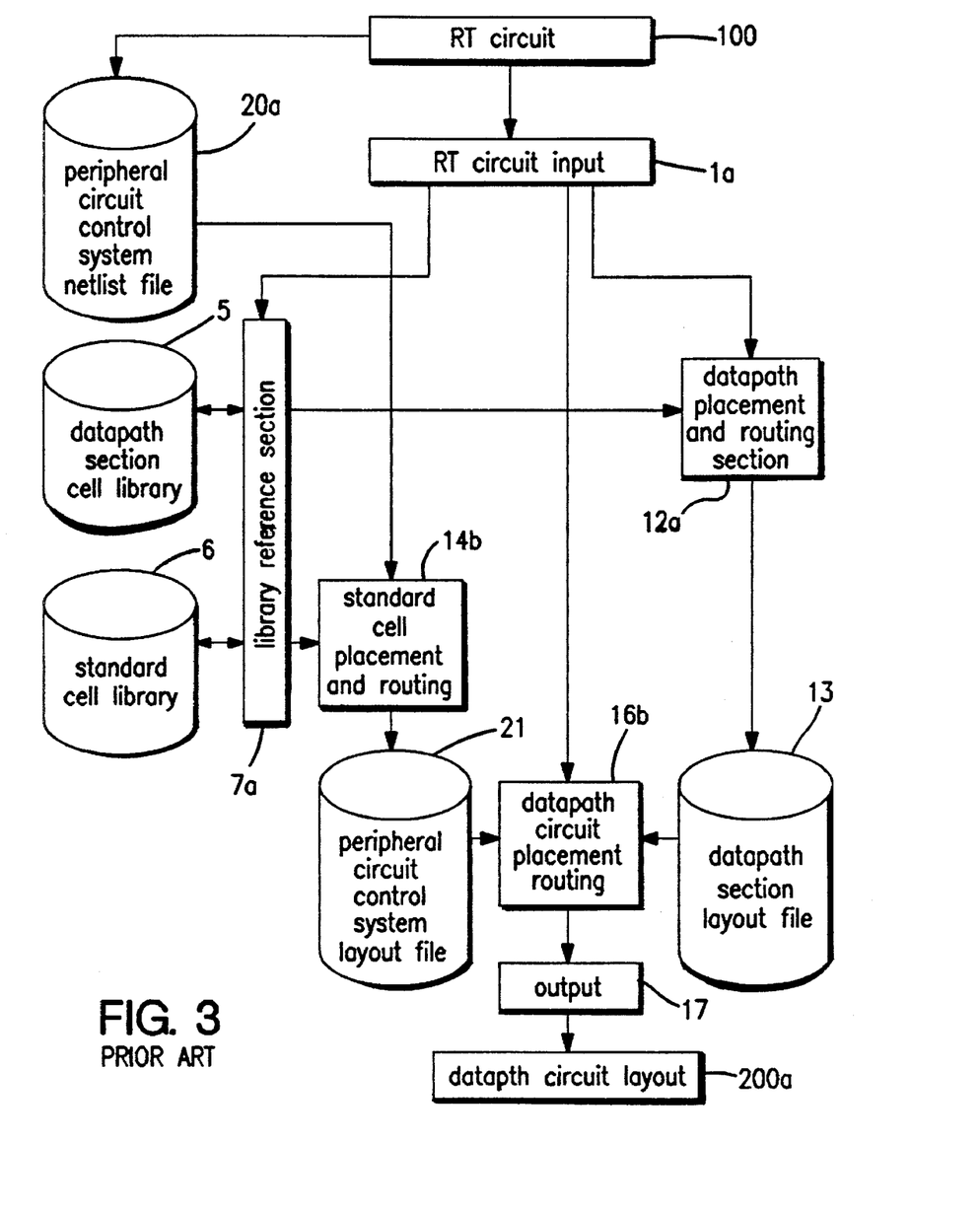
FIG. 3 is a block diagram illustrative of the conventional datapath circuit layout creation system.

Processes for automatic layout design by use of the conventional datapath circuit layout creation system and structures thereof will be described with reference to FIG. 3. The datapath circuit layout creation system includes a RT circuit diagram input section 1a into which a RT circuit diagram 100 of the datapath circuit is inputted. The system also includes a peripheral circuit/control system netlist file 20a for storing a peripheral circuit/control system netlist including information of the peripheral circuit and the control system as well as interconnections between them wherein the netlist was created with referring to the RT circuit diagram 100. The system also has a datapath section cell library 5 for storing data including informations of configurations, structures and interconnections of a plurality of the datapath section cells having the RT levels and involved in the RT circuit diagrams. The system also has a standard cell library for storing data including information of configurations, structures and interconnections of a plurality of the standard cells involved in the datapath circuit to construct the peripheral circuit and the control system. The system also has a library reference section 7a for referring to the datapath section cell library 5 and the standard cell library 6 for subsequent output of predetermined data according to information of the circuit diagram fetched from the RT circuit diagram input section 1a. The system also includes a datapath placement and routing section 12a for fetching both information of the circuit diagram from the RT circuit diagram input section 1a and data of the datapath section cells from the library reference section 7a for subsequent determinations of placements of the datapath section cells and interconnections between them to define a datapath section layout. The system also includes a datapath section layout file 13 for storing the layout of the datapath section determined by the datapath placement and routing section 12a. The system also has a standard cell placement and routing section 14b for fetching both the peripheral circuit/control system netlist from the peripheral circuit/control system netlist file 20a and information of the standard cells from the library reference section 7a for subsequent determinations of placements of the standard cells in the peripheral circuit and in the control system and interconnections between the standard cells to define a layout of the peripheral circuit/control system section. The system also has a peripheral circuit/control system layout file 21 for storing the peripheral circuit/control system layout determined by the standard cell placement and routing section 14b. The system also has a datapath section layout file 13 for storing the datapath section layout defined by the datapath placement and routing section 12a. The system also has a datapath circuit placement and routing section 16b for fetching the datapath Section layout from the datapath section layout file 13, the peripheral circuit/control system layout from the peripheral circuit/control system layout file 21 and information of the circuit diagram from the RT circuit diagram input section 1a for subsequent determinations of placements of the individual datapath section and the peripheral circuit/control systems and interconnections between them as well as interconnections of them to connective terminals to define the datapath circuit layout. The system also has an output section 17 for fetching the datapath circuit layout from the datapath circuit placement and routing section 16b for subsequent output thereof as a result 200a of the datapath circuit layout.

According to the foregoing conventional datapath circuit layout creation system, the layout of the datapath section is determined on the basis of the circuit diagram information and the data of the datapath section cells, while the layout of the peripheral circuit/control system is determined on the basis of the peripheral circuit/control system netlist and the data of the standard cells. Then, the layout of the datapath circuit is determined on the basis of the above both layouts of the datapath sections and the peripheral circuit/control system as well as the circuit diagram information.

The above described conventional datapath circuit layout creation system is engaged with a problem with difficulty in and time-consuming process in creation of the peripheral circuit/control system netlist. The difficulty and the time-consuming processes are caused by the coexisting of the peripheral circuits and the control systems, although the Coexisting thereof are actually required.

Figure 4:
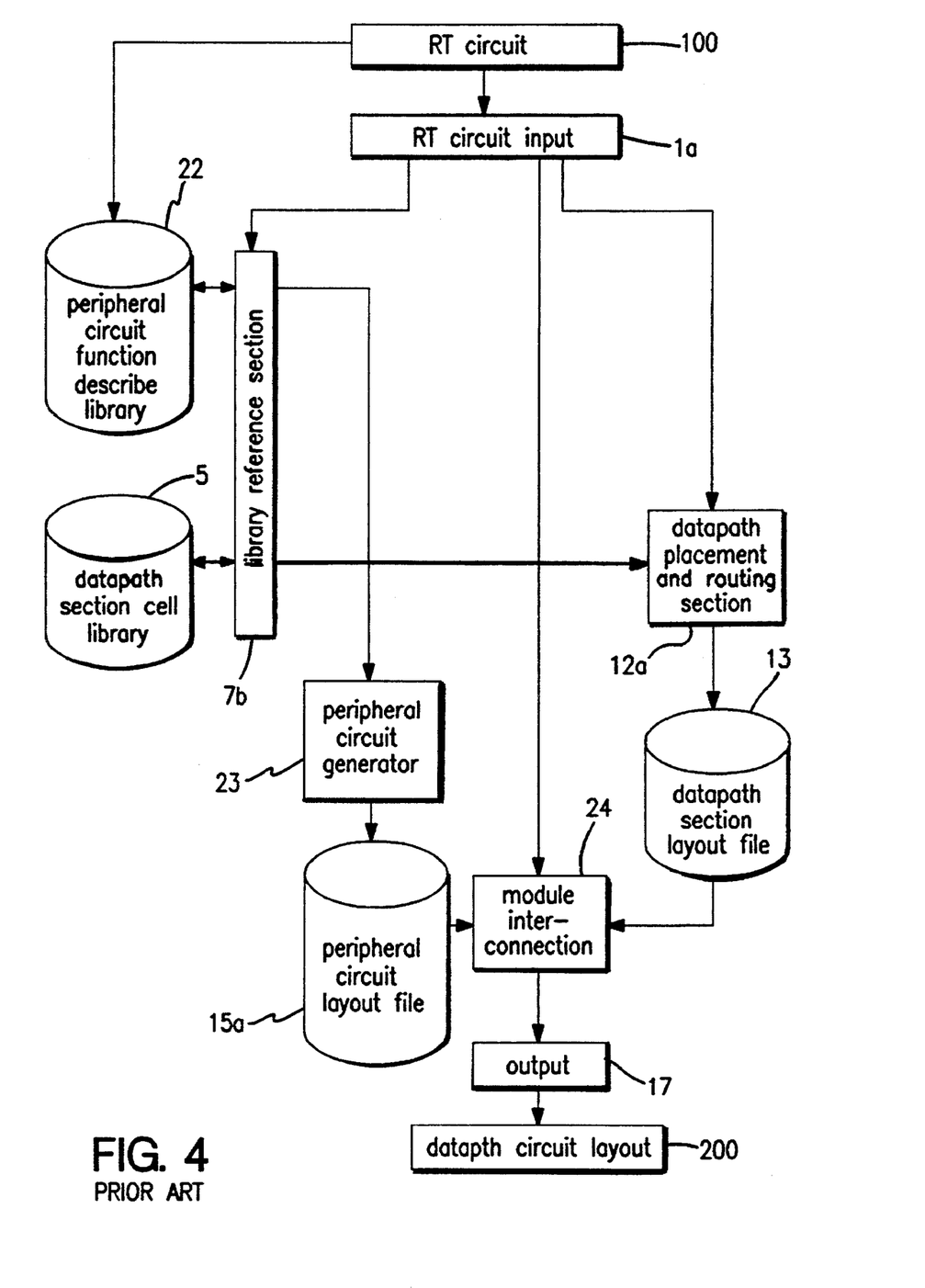
FIG. 4 is a block diagram illustrative of the another conventional datapath circuit layout creation system.

Another datapath circuit layout creation system has also been known in the art which will be described with reference to FIG. 4 in which the netlist includes only the peripheral circuit, but no control system. The process for determining the datapath section layout is the same as that of the above described conventional system, while a peripheral circuit function describe library 22 is created by referring to the RT circuit diagram 100 for determination of the peripheral circuit layout in a transistor level by a peripheral circuit generator 23 on the basis of the peripheral circuit functions stored in the peripheral circuit function describe library. A module routing section 24 fetches the peripheral circuit layout from the peripheral circuit layout file 15a, the datapath section layout from the datapath section layout file 13 and the RT circuit diagram information from the RT circuit diagram input section 1a for subsequent routing between the datapath section layout and the peripheral circuit layout on the basis of the circuit diagram to define the layout of the datapath circuit.

This other conventional system is also engaged with the following problem. The peripheral circuit generator 23 creates the peripheral circuit layout at the transistor level. It is then required to match the peripheral circuit layout to the cell level layout. This requires extra time. The creation of the peripheral circuit function describe library also takes a considerable amount of time.

SUMMARY OF THE INVENTION

Accordingly, it is a primary object of the present invention to provide a novel system for creating a layout of datapath circuits free from any problems as described above.

It is a further object of the present invention to provide a novel system for creating a layout of datapath circuits including a peripheral circuit hybrid with a control system in a short time.

The above and other objects, features and advantages of the present invention will be apparent from the following descriptions.

The invention provides a novel datapath circuit creating system. The system has an RT circuit of a datapath circuit provided with a plurality of datapath sections having predetermined functions and being described by symbols of a plurality of primitive datapath section cells at a resistor transfer level. The system also has an RT primitive circuit library for storing configuration data of the peripheral circuits determined from configuration data and predetermined data of plural datapath section cells constructing the datapath section in which the datapath section cells corresponds to the individual datapath sections of the RT circuit diagram. The system also has a datapath section cell library for storing configuration data of individual datapath section cells in the RT primitive circuit library. The system also has a peripheral circuit library for storing configuration data of predetermined standard cells constructing each peripheral circuit in each datapath section in the RT primitive circuit library. The system also has a standard cell library for storing configuration data of each standard cell in the peripheral circuit library. The system also has a library reference section for referring store data in the RT primitive circuit library, the datapath section cell library, the peripheral circuit library and the standard cell library respectively on the bases of the circuit diagram information from the RT circuit diagram input section for subsequent output of a result of the reference. The system also has a netlist extract section for extracting netlists including information of connection paths of the datapath circuit according to the circuit diagram information from the RT circuit input section and the data of the library reference section. The system also has a netlist dividing section for dividing the netlist from the netlist extract section into a datapath section netlist connective to the each datapath section cell in the plural datapath section, a peripheral circuit netlist connective to each standard cell in the peripheral circuit and a central netlist for interconnections among the connective terminals, the plural datapath sections and the peripheral circuits. The system also has a datapath section netlist file for storing the datapath section netlist, a peripheral circuit netlist file for storing the peripheral circuit netlist and a central netlist file for storing the central netlist. The system also has a datapath placement and routing section for determining a datapath section layout including placements and connection paths of the datapath section cells in the plural datapath sections according to the datapath section netlist and the data from the library reference section. The system also has a standard cell placement and routing section for determining a peripheral circuit layout including placements and connection paths of the standard cells in the peripheral circuit according to the peripheral circuit netlist and the data from the library reference section. The system also has a datapath section layout file for storing the datapath section layout and a peripheral circuit layout file for storing the peripheral circuit layout. The system also has a datapath section layout file for storing the datapath section layout and a peripheral circuit layout file for storing the peripheral circuit layout. The system also has a datapath circuit placement and routing section for determining a datapath circuit layout including the placements of the plural datapath sections in the datapath circuit, the peripheral circuit and the connective terminals and the interconnection paths among them on the basis of the central netlist in which the determination is made according to the layouts from the datapath section layout file and the peripheral circuit layout file as well as the most significant netlist from the most significant netlist file. The system also has an output section for output of the datapath circuit layout determined by the datapath circuit placement and routing section.

BRIEF DESCRIPTIONS OF THE DRAWINGS

Preferred embodiments of the present invention will hereinafter fully be described in detail with reference to the accompanying drawings.

PREFERRED EMBODIMENTS

Figure 5:
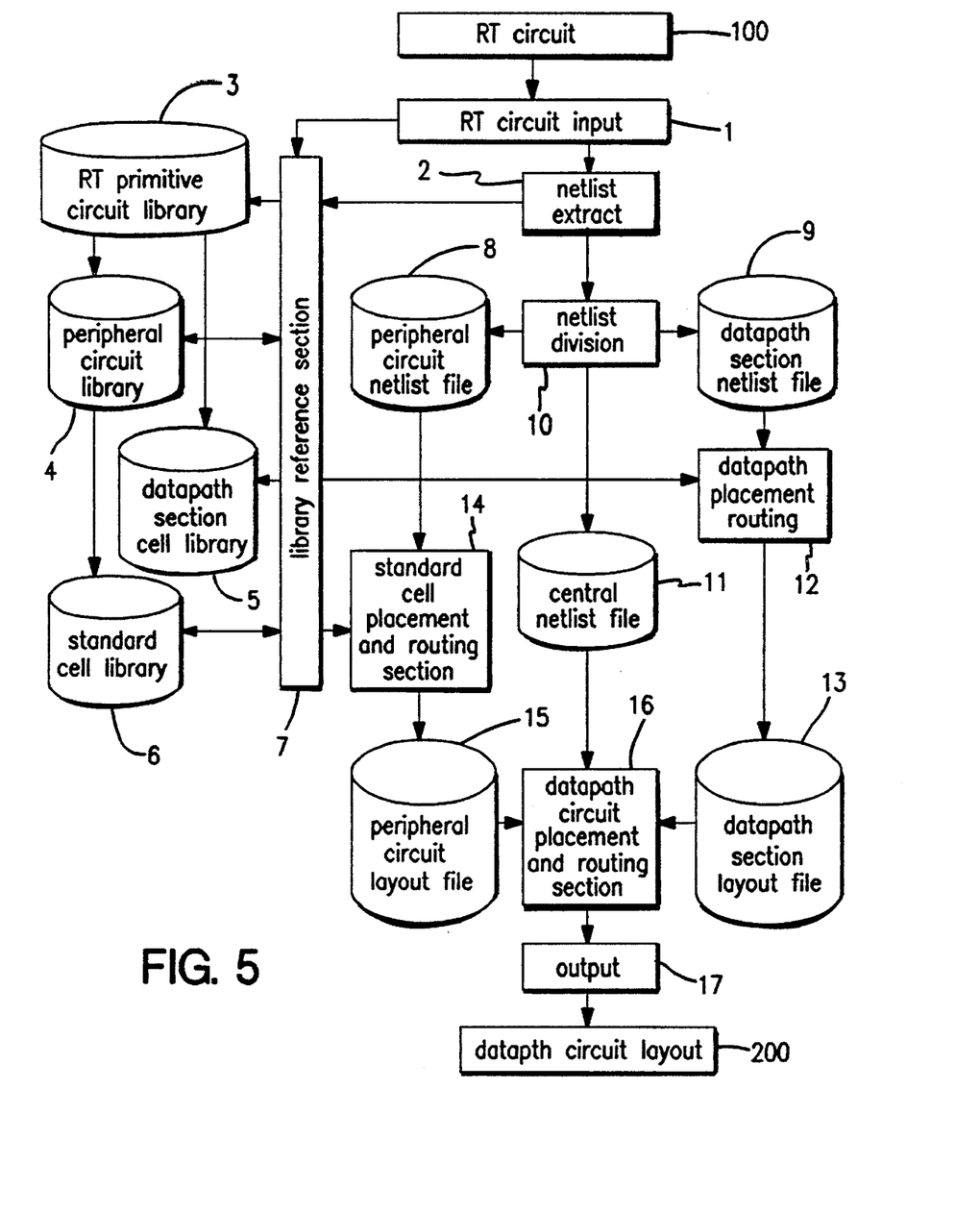
FIG. 5 is a block diagram illustrative of a novel datapath circuit layout creation system in a first embodiment according to the present invention.

A first embodiment according to the present invention will be described in detail with reference to FIG. 5 in which a novel datapath circuit layout creation system is provided. The system has an RT circuit 100 of a datapath circuit provided with a plurality of datapath sections having predetermined functions and being described by symbols of a plurality of primitive datapath section cells at a resistor transfer level. The system also has an RT primitive circuit library 3 for storing configuration data of the peripheral circuits automatically determined from configuration data and predetermined data of plural datapath section cells constructing the datapath section in which the datapath section cells corresponds to the individual datapath sections of the RT circuit diagram 100. The system also has a datapath section cell library 5 for storing configuration data of individual datapath section cells in the RT primitive circuit library 3. The system also has a peripheral circuit library 4 for storing configuration data of predetermined standard cells constructing each peripheral circuit in each datapath section in the RT primitive circuit library 3. The system also has a standard cell library 6 for storing configuration data of each standard cell in the peripheral circuit library 4. The system also has a library reference section 7 for referring stored data in the RT primitive circuit library 3, the datapath section cell library 5, the peripheral circuit library 4 and the standard cell library 6 respectively on the basis of the circuit diagram information from the RT circuit diagram input section 1 for subsequent output of a result of the reference. The system also has a netlist extract section 2 for extracting netlists including information of connection paths of the datapath circuit according to the circuit diagram information from the RT circuit input section 1 and the data of the library reference section 7. The system also has a netlist dividing section 10 for dividing the netlist from the netlist extract section 2 into a datapath section netlist connective to each datapath section cell in the plural datapath section, a peripheral circuit netlist connective to each standard cell in the peripheral circuit and a central netlist for interconnections among the connective terminals, the plural datapath sections and the peripheral circuits. The system also has a datapath section netlist file 9 for storing the datapath section netlist, a peripheral circuit netlist file 8 for storing the peripheral circuit netlist and a central netlist file 11 for storing the central netlist. The system also has a datapath placement and routing section 12 for determining a datapath section layout including placements and connection paths of the datapath section cells in the plural datapath sections according to the datapath section netlist and the data from the library reference section 7. The system also has a standard cell placement and routing section 14 for determining a peripheral circuit layout including placements and connection paths of the standard cells in the peripheral circuit according to the peripheral circuit netlist and the data from the library reference section 7. The system also has a datapath section layout file 13 for storing the datapath section layout and a peripheral circuit layout file 15 for storing the peripheral circuit layout. The system also has a datapath circuit placement and routing section 16 for determining a datapath circuit layout including the placements of the plural datapath sections in the datapath circuit, the peripheral circuit and the connective terminals and the interconnection paths among them on the basis of the central netlist in which the determination is made according to the layouts from the datapath section layout file 13 and the peripheral circuit layout file 15 as well as the central netlist from the central netlist file 11. The system also has an output section for output of the datapath circuit layout determined by the datapath circuit placement and routing section 16.

The processes for creating the datapath circuit layout by the above described system will be described. The RT primitive circuit library 3, the peripheral circuit library 4, the datapath section cell library 65 and the standard cell library are prepared respectively in which the datapath section cell library 5 and the standard cell library 6 may be the same as those of the prior art. The RT primitive circuit library 3 includes all the datapath section cells described in the RT circuit diagram as primitive datapath section cells. The peripheral circuit configuration is necessarily defined by kinds and the number of the datapath section cells in each datapath section. Then, the RT circuit diagram 100 includes information of the datapath section cells but no information of the peripheral circuit. The peripheral circuit library 4 includes configuration data of the peripheral circuit, for example, standard cell configuration data, connection path data and other data. The netlist extract section 2 extracts the netlists including all connection path information of the datapath circuit from the circuit diagram information of the RT circuit diagram input section 1 and the peripheral circuit configuration data from the library reference section 7. The netlist dividing section 10 fetches the netlist from the netlist extracting section 2 for division of the netlist into the peripheral netlist, the datapath section netlist and the central netlist. The datapath placement and routing section 12 fetches the datapath section netlist from the datapath section netlist file 9 and the configuration data of the datapath section cells for subsequent determination of the datapath section layout to be stored in the datapath section layout file 13. The standard cell placement and routing section 14 fetches the peripheral circuit netlist from the peripheral circuit netlist file 8 and configuration data of the peripheral circuit from the library reference section 7 for subsequent determination of the peripheral circuit layout to be stored in the peripheral circuit layout file 15. The datapath circuit placement and routing section 16 fetches the central netlist from the central netlist file 11, the peripheral circuit layout from the peripheral circuit layout file 15 and the datapath section layout from the datapath section layout file 13 for subsequent determinations of the placements of the plural datapath sections, the peripheral circuits and the connective terminals and interconnections among them to define the layout of the datapath circuit.

According to the above described system of the first embodiment, input of only the circuit configuration data of the datapath section cells constructing the datapath section leads to an automatic determination of the configurations at the cell level of the peripheral circuit corresponding to the datapath section for subsequent determinations of the layout of the datapath circuit layout from the configuration data and the netlist of the peripheral circuit, the datapath section cells and the standard cells. Contrary to the prior art, it is not necessary to prepare the peripheral circuit function descriptive library according to the configuration data of the datapath sections. This facilitates the creation of the layout of the datapath circuit and reduces the necessary time for creating the same because all the descriptive levels may be unified to the cell level.

Figure 6:
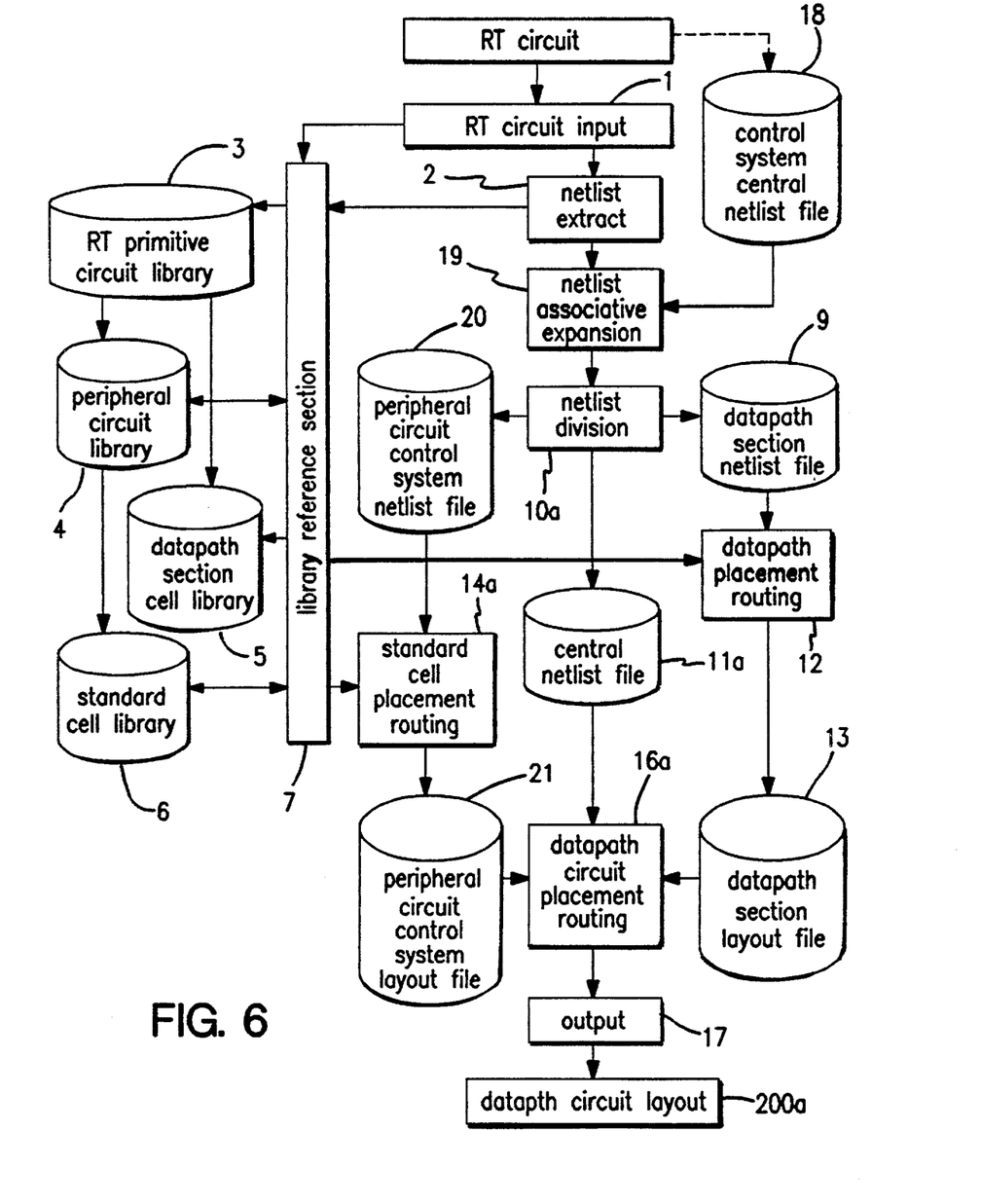
FIG. 6 is a block diagram illustrative of a novel datapath circuit layout creation system in a second embodiment according to the present invention.

A second embodiment according to the present invention will be described in detail with reference to FIG. 6 in which a novel datapath circuit layout creating system is provided. The system of the second embodiment has a difference in configuration from the system of the first embodiment. The difference is in further providing a control system central netlist file 18 and a netlist associative expansion section 19 in which the control system central netlist file 18 stores a control system netlist including informations of interconnections in the standard cells in the control system as well as connections between the control system and the individual datapath sections or the peripheral circuits, while the netlist associative expansion section 19 associates the control system central netlist with a netlist from a netlist extract section 2 for subsequent expansion thereof. Further, the system has an RT circuit 100 of a datapath circuit provided with a plurality of datapath sections having predetermined functions and being described by symbols of a plurality of primitive datapath section cells at a resistor transfer level. The system also has an RT primitive circuit library 3 for storing configuration data of the peripheral circuits automatically determined from configuration data and predetermined data of plural datapath section cells constructing the datapath section in which the datapath section cells corresponds to the individual datapath sections of the RT circuit diagram 100. The system also has a datapath section cell library 5 for storing configuration data of individual datapath section cells in the RT primitive circuit library 3. The system also has a peripheral circuit library 4 for storing configuration data of predetermined standard cells constructing each peripheral circuit in each datapath section in the RT primitive circuit library 3. The system also has a standard cell library 6 for storing configuration data of each standard cell in the peripheral circuit library 4. The system also has a library reference section 7 for referring stored data in the RT primitive circuit library 3, the datapath section cell library 5, the peripheral circuit library 4 and the standard cell library 6 respectively on the bases of the circuit diagram information from the RT circuit diagram input section 1 for subsequent output of a result of the reference. The system also has a netlist extract section 2 for extracting netlists including informations of connection paths of the datapath circuit according to the circuit diagram information from the RT circuit input section 1 and the data of the library reference section 7. The system also has a netlist dividing section 10a for dividing the netlist from the netlist associative expansion section 19 into a datapath section netlist connective to the each datapath section cell in the plural datapath section, a peripheral circuit control system netlist connective to the each standard cell in the peripheral circuit and in the control system and a central netlist for interconnections among the connective terminals, the plural datapath sections, the peripheral circuits and the control system. The system also has a datapath section netlist file 9 for storing the datapath section netlist, a peripheral circuit control system netlist file 20 for storing the peripheral circuit control system netlist and a central netlist file 11a for storing the central netlist. The system also has a datapath placement and routing section 12 for determining a datapath section layout including placements and connection paths of the datapath section cells in the plural datapath sections according to the datapath section netlist and the data from the library reference section 7. The system also has a standard cell placement and routing section 14a for determining both a peripheral circuit control system layout and a control system layout including placements and connection paths of the standard cells in the peripheral circuit and in the control system according to the peripheral circuit control system netlist and the data from the library reference section 7. The system also has a datapath section layout file 13 for storing the datapath section layout and a peripheral circuit control system layout file 21 for storing the peripheral circuit control system layout. The system also has a datapath circuit placement and routing section 16a for determining a datapath circuit layout including the placements of the plural datapath sections in the datapath circuit, the peripheral circuit and the connective terminals, the control system and the interconnection paths among them on the basis of the central netlist in which the determination is made according to the layouts from the datapath section layout file 13 and the peripheral circuit control system layout file 21 as well as the central netlist from the central netlist file 11a. The system also has an output section for output of the datapath circuit layout determined by the datapath circuit placement and routing section 16.

The processes for creating the datapath circuit layout by the above described system will be described. The RT primitive circuit library 3, the peripheral circuit library 4, the datapath section cell library 5 and the standard cell library are prepared respectively in which the datapath section cell library 5 and the standard cell library 6 may be the same as those of the prior art. The RT primitive circuit library 3 includes all the datapath section cells described in the RT circuit diagram as primitive datapath section cells. The peripheral circuit configuration is necessarily defined by kinds and the number of the datapath section cells in each datapath section. Then, the RT circuit diagram 100 includes information of the datapath section cells but no information of the peripheral circuit. The peripheral circuit library 4 includes configuration data of the peripheral circuit, for example, standard cell configuration data, connection path data and other data. The netlist extract section 2 extracts the netlists including all connection path information of the datapath circuit from the circuit diagram information of the RT circuit diagram input section 1 and the peripheral circuit configuration data from the library reference section 7. The control system central netlist file 18 stores the control system netlist including informations of interconnections in the standard cells in the control system as well as connections between the control system and the individual datapath sections or the peripheral circuits. The netlist associative expansion section 19 associates the control system central netlist with the netlist from the netlist extract section 2 for subsequent expansion thereof. The netlist dividing section 10a fetches the associated and expanded netlist from the netlist associative and expansion section 19 for division of the netlist into the peripheral netlist, the datapath section netlist and the central netlist. The datapath placement and routing section 12 fetches the datapath section netlist from the datapath section netlist file 9 and the configuration data of the datapath section cells for subsequent determination of the datapath section layout to be stored in the datapath section layout file 13. The standard cell placement and routing section 14a fetches the peripheral circuit and control system netlist from the peripheral circuit control system netlist file 20 and configuration data of the peripheral circuit from the library reference section 7 for subsequent determination of the peripheral circuit control system layout to be stored in the peripheral circuit control system layout file 21. The datapath circuit placement and routing section 16 fetches the central netlist from the central netlist file 11a, the peripheral circuit control system layout from the peripheral circuit control system layout file 21 and the datapath section layout from the datapath section layout file 13 for subsequent determinations of the placements of the plural datapath sections, the peripheral circuits and the connective terminals and interconnections among them to define the layout of the datapath circuit.

According to the above described system of the second embodiment, input of only the circuit configuration data of the datapath section cells constructing the datapath section leads to an automatic determination of the configurations at the cell level of the peripheral circuit corresponding to the datapath section for subsequent determinations of the layout of the datapath circuit layout from the configuration data and the netlist of the peripheral circuit, the datapath section cells and the standard cells. Contrary to the prior art, it is not necessary to prepare the peripheral circuit function descriptive library according to the configuration data of the datapath sections. This facilitates the creation of the layout of the datapath circuit and reduces the necessary time for creating the same because all the descriptive levels may be unified to the cell level.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the spirit and scope of the invention.

What is claimed is:

1. A system for creating a layout of datapath circuits comprising:

a first means for storing a datapath circuit information at a resistor transfer level;

a second means for automatically determining configuration data of peripheral circuits from configuration data of plural datapath section cells constructing said datapath section for storing primitive circuit data;

a third means for storing configuration data of individual datapath section cells in said second means;

a fourth means for storing configuration data of predetermined standard cells constructing each peripheral circuit in each datapath section in said second means;

a fifth means for storing configuration data of each standard cell in said fourth means;

a sixth means for referring stored data in said second, third, fourth and fifth means on the basis of said datapath circuit information in said first means;

a seventh means for extracting netlists including information of connection paths of said datapath circuit according to said circuit information from said first means and said data of said sixth means;

an eighth means for dividing said netlist from said seventh means into a datapath section netlist connective to each of said datapath section cells in said plural datapath section, a peripheral circuit netlist connective to each standard cell in the peripheral circuit and a central netlist for interconnections among said connective terminals, said plural datapath sections and said peripheral circuits;

a tenth means for determining a datapath section layout including placements and connection paths of said datapath section cells in said plural datapath sections according to said datapath section netlist and said data from said sixth means;

an eleventh means for determining a peripheral circuit layout including placements and connection paths of said standard cells in said peripheral circuit according to said peripheral circuit netlist and said data from said sixth means; and a twelfth means for determining a datapath circuit layout including said placements of said plural datapath sections in said datapath circuit, said peripheral circuit and said connective terminals and said interconnection paths among them on the basis of said central netlist in which the determination is made according to said layouts from a datapath section layout file and a peripheral circuit layout file as well as a central netlist from a central netlist file.

2. The system as claimed in claim 1, further comprising:
a thirteen means for associating a control system central netlist with said netlist from said seventh means for subsequent expansion thereof.

3. A system for creating a layout of datapath circuits comprising:

an RT circuit information storage section;

an RT primitive circuit library for storing configuration data of the peripheral circuits automatically determined from configuration data and predetermined data of plural datapath section cells constructing the datapath section in which the datapath section cells correspond to the individual datapath sections of the RT circuit information;

a datapath section cell library for storing configuration data of individual datapath section cells in the RT primitive circuit library;

a peripheral circuit library for storing configuration data of predetermined standard cells constructing each peripheral circuit in each datapath section in the RT primitive circuit library;

a standard cell library for storing configuration data of each standard cell in the peripheral circuit library;

a library reference section for referring stored data in the RT primitive circuit library, the datapath section cell library, the peripheral circuit library and the standard cell library respectively on the basis of the circuit diagram information from an RT circuit diagram input section for subsequent output of a result of the reference;

a netlist extract section for extracting netlists including information of connection paths of the datapath circuit according to the circuit diagram information from the RT circuit input section and the data of the library reference section;

a netlist dividing section for dividing the netlist from the netlist extract section into a datapath section netlist connective to the each datapath section cell in the plural datapath section, a peripheral circuit netlist connective to each standard cell in the peripheral circuit and a central netlist for interconnections among the connective terminals, the plural datapath sections and the peripheral circuits;

a datapath section netlist file for storing the datapath section netlist, a peripheral circuit netlist file for storing the peripheral circuit netlist and a central netlist file for storing the central netlist;

a datapath placement and routing section for determining a datapath section layout including placements and connection paths of the datapath section cells in the plural datapath sections according to the datapath section netlist and the data from the library reference section;

a standard cell placement and routing section for determining a peripheral circuit layout including placements and connection paths of the standard cells in the peripheral circuit according to the peripheral circuit netlist and the data from the library reference section;

a datapath section layout file for storing the datapath section layout and a peripheral circuit layout file for storing the peripheral circuit layout; and a datapath circuit placement and routing section for determining a datapath circuit layout including the placements of the plural datapath sections in the datapath circuit, the peripheral circuit and the connective terminals and the interconnection paths among them on the basis of the central netlist in which the determination is made according to the layouts from the datapath section layout file and the peripheral circuit layout file as well as a central netlist from the central netlist file.

4. The system as claimed in claim 1, further comprising:
a control system central netlist file for storing a control system netlist including information of interconnections in the standard cells in the control system as well as connections between the control system and the individual datapath sections or the peripheral circuits; and a netlist associative expansion section for associating the control system central netlist with the netlist from the netlist extract section for subsequent expansion thereof.

* * * * *